United States Patent [19]

Pettit

[11] Patent Number: 4,768,014
[45] Date of Patent: Aug. 30, 1988

[54] NON-VERBAL COMMUNICATION SYSTEM FOR WORK STATIONS

[75] Inventor: Michael C. Pettit, Arden, N.C.

[73] Assignee: Westinghouse Electric Corp., Pittsburgh, Pa.

[21] Appl. No.: 926,294

[22] Filed: Nov. 3, 1986

[51] Int. Cl.[4] ............................................. G08B 5/00
[52] U.S. Cl. .............................. 340/332; 340/815.31; 29/721; 29/741
[58] Field of Search .............. 340/332, 815.23, 815.31; 29/720, 721, 740, 741

[56] References Cited

U.S. PATENT DOCUMENTS 3,624,676 11/1971 Whitney.
3,705,347 12/1972 Tuller.
3,739,339 6/1973 Hillhouse et al.
3,836,911 9/1974 Gibson et al.
3,852,865 12/1974 Ragard.
4,178,708 12/1979 Fletcher et al.
4,318,222 3/1982 Fröhlich ............................... 29/721

Primary Examiner—Joseph A. Orsino, Jr.
Assistant Examiner—Brian R. Tumm
Attorney, Agent, or Firm—L. P. Johns

[57] ABSTRACT

A non-verbal communication system for work stations characterized by a work station for the assembly of parts by an assembly operator into a workpiece which work bench includes a plurality of bins for storage of various parts; a punch card reader at the work station including a light source and an array of separate aperture areas disposed in juxtaposed columns and rows, and a plurality of fiber-optic cables having first terminal ends disposed at the aperture areas and having second terminal ends located in the several parts bins, thereby illuminating indicators at the bins of specific parts to be selected by an assembly operator for assembly into a workpiece.

3 Claims, 1 Drawing Sheet

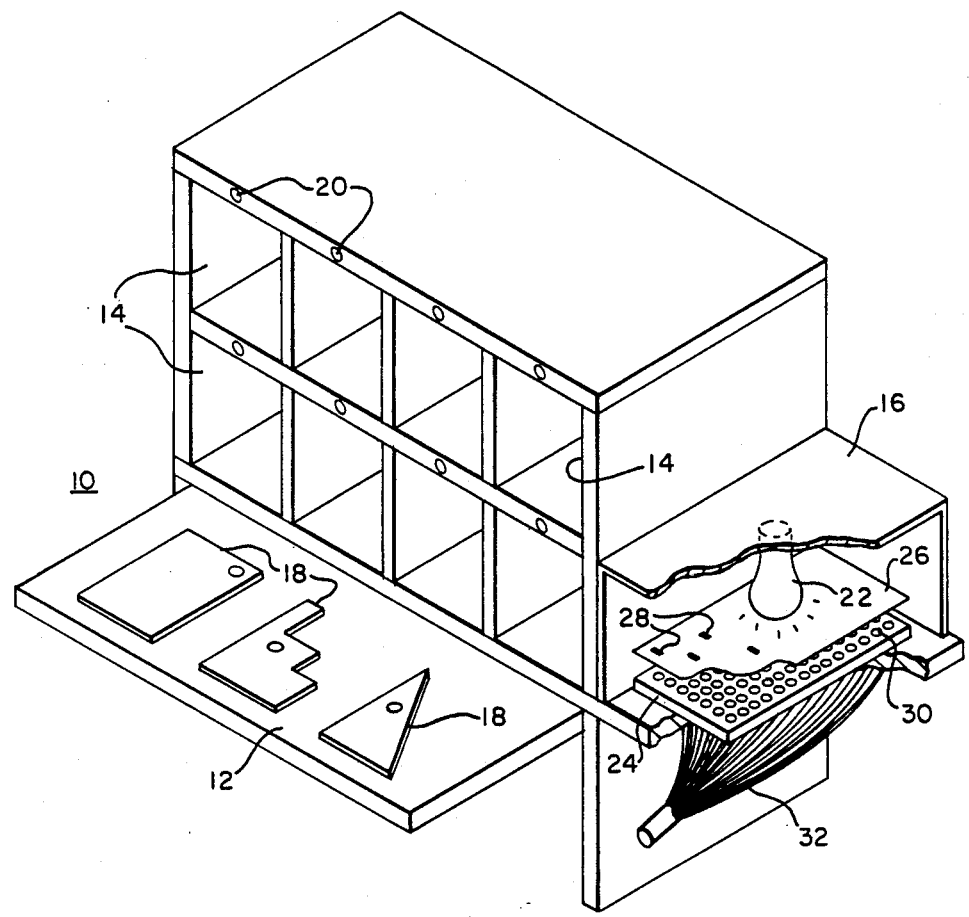

NON-VERBAL COMMUNICATION SYSTEM FOR WORK STATIONS

BACKGROUND OF THE INVENTION

1. Field of the Invention

This invention relates to a communication system for work stations and, more particularly, it pertains to a non-verbal communication system including fiber-optic cables.

2. Description of the Prior Art

There are specific needs in manufacturing to communicate information regarding, among other things, components needed to make up an assembly or the proper location to place these components or the type of eletrical tests to perform on the assembly. On many product lines, there are variations of the same basic product where each variation involves some small change in components or configuration. Often, great quantities of certain products and a small quantity of others are produced. Since the bulk of parts and pieces are common, it is preferable to build all the models on the same work station. Production is normally staged by grouping together orders for the same product and running them all at the same time. After running all the high volume products, the low volume ones are run.

It is expedient to produce products in a mixed instead of a staged sequence. In order to expedite production and provide improvements in customer service to reduce inventory and lead time, the communications of what to do at each work station are necessary. Often low volume products are easy to build but time is required to consult drawings and bills of materials to find out what makes a low volume product unique and different from the high volume models. Such information is transmitted to each assembly operator at each assembly work station which is not efficient for mixed mode assembly because of the time involved.

SUMMARY OF THE INVENTION

It is has been found in accordance with this invention that a non-verbal communication system for assembly of a specific set of parts into a work piece may be provided which system comprises a work station for the assembly of various parts into a work piece. A plurality of bins for storage of various parts in several bins are adjacent to the work station. A punch card reader is located at the work station and includes a light source and an array of separate aperture areas disposed in juxtaposed columns and juxtaposed rows spaced from the light source and is adapted for insertion of a punched card therebetween. A plurality of fiber-optic cables having first terminal ends are disposed to transmit light from the light source to second terminal ends. The first terminal ends are disposed in juxtaposed positions corresponding to the juxtaposed columns and rows of separate aperture areas. The second terminal ends are arranged in the several parts bins. The space between the source of light and the aperture areas is adapted to receive a punch card having columns and rows of aperture areas corresponding to the separate aperture areas with selectively determined punched out aperture areas produced by informed development of a computer for enabling the transmission of light therethrough to illuminate corresponding first terminal ends of the fiber-optic cables. The second terminal ends of congruent fiber-optic cables are visible at specific parts bins so as to indicate to an assembly operator which parts to select for assembly of a particular workpiece.

In another embodiment of the invention, the second terminal portion of each fiber-optic cable is arranged in at least one separate parts bin.

The advantage of the system of this invention is that it allows non-verbal communication between a computer and other machines or people using punch cards and fiber-optics. It enables the manufacture of similar products on an assembly bench with great variability and little chance of operator error due to communications.

BRIEF DESCRIPTION OF THE DRAWINGS

The single view of the drawing is an isometric view of a work station having a plurality of bins for storing various parts and a card reader in accordance with this invention.

DESCRIPTION OF THE PREFERRED EMBODIMENT

In the drawing, a work station is generally indicated at 10 and it comprises an assembly bench 12, a plurality of bins 14 for storage of various parts to be used in a workpiece, and a card reader 16. The assembly bench 12 is preferably a horizontal surface of which an assembly operator may assemble specific parts for a prescribed workpiece (not shown). For that purpose assembly fixtures 18 of various configurations may or may not be employed.

The storage bins 14 are disposed at locations proximate to the assembly bench 12. Each bin 14 preferably contains a plurality of similar parts to be used in the assembly. Each bin includes an indicator light 20.

The card reader 16 is a box-like structure containing a light source, or electric light bulb 22, and a plate or surface 24. An instruction sheet or card 26, such as a punch card or tape having programmed instructions thereon, is placed between the light source 22 and the plate 24. For the purpose of simplicity of illustration the card 26 is a standard punch including a plurality of longitudinally and laterally spaced apertures 28 which are disposed juxtaposed columns and juxtaposed rows of apertures. The punched out apertures are preferably produced by information developed by a computer. When a card is placed in the card reader 16, the apertures 28 align with openings 30 in the plate or surface 24, whereby light from the light source 22 passes through the apertures 28 and into the openings 30.

A plurality of optic fibers 32 are provided in conjunction with the openings 30, each fiber having a terminal end disposed in one opening. The other end of each fiber extends to one of the indicator lights 20 of the storage bins 14. Accordingly, by placing various prepunched cards in the reader 16, each card 26 being coded for a particular product, lights appear to indicate to an assembly operator, the appropriate parts to use for the assembly. The fibers 32 are shielded polymer fibers although other types of optic fibers may be used, and they are terminated using electrical wire crimp-type terminals. The presence or absence of light at each bin is a direct non-verbal communication to the assembly operator of what parts are to be selected. In some cases, where two or more parts are always used together, more than one fiber 32 may extend from each opening 30 to more than one indicator light 20.

Moreover, additional fibers 32 may be used to extend inside an assembly fixture 18 to indicate the exact position of a part or parts when this is also a variable. The card may also be read verbally since it has both printing and apertures 28. In additon, other machines may interface with the card using conventional electronic card readers, or photoceptor inputs may be added to convert the fiber output into electric signals that may be used to drive pick and place robots, automatic test equipment and packaging equipment.

To fully appreciate the use of the work station communicator an example of a manufacturing system is as follows:

A customer order is transmitted into a computer. At the proper time, the computer issues a shop order which consists of a group of punch cards containing a customer's order, quantity, shop order, and coding data. These are sent to the various assembly lines. At the first work station on each line, each assembly operator notes the quantity, they places the first punch card in the work station reader and proceeds to assemble that portion of the job. After producing the first assembly, it is passed down the line along with the rest of the punch cards, but retain the first card until all of the units on the order are completed. At the next, and each subsequent work station, a card is placed into the reader and assemblies are produced.

At the next-to-test work station, several key fibers are connected to an assembly robot and test station. The card here selects the proper program for the robot and the tester limits. The robot grasps the units, and disposes each to either the packaging or repair area. Both robot and tester are driven by the coded punch card. After all assembly, testing, and packaging operations are complete, an operator at the pack area places a card into a conventional card input device, keys in any variations on a terminal, and the computer recognizes that the shop order is complete and directs a printer to the pack area to print out the packing list and shipping papers. The cards are then disposed of.

If any unexpected event occurs on the production line, production is stopped on the particular workpiece involved and another workpiece is begun. The cards and any work-in-process assemblies are pulled off the line if necessary.

Manifestly, the non-verbal communication system of this invention enables a production of products in the exact order that a customer prefers and low volume products are assembled with the correct parts and tested to the correct specifications automatically. This system eliminates the need for high skill effort in the assembly area to handle interpretation and communications of any product change information. The system has no language barrier and may be developed and set up in an English languate and used in any other environment.

In conclusion, the system of this invention enables non-verbal communication between a computer and other machines or work assembly operators using punch cards and fiber-optics. It also enables the manufacture of similar products on an assembly bench with greater variability and little change of operator error due to communications.

What is claimed is:

1. A non-verbal communication system for the assembly of a specific set of parts into a workpiece and comprising:
    (a) a work station for the assembly of various parts into a workpiece;
    (b) a plurality of bins for storage of various parts in several bins adjacent to the work station;
    (c) a light source;
    (d) a plurality of fiber-optic cables having first terminal ends disposed to transmit light from the light source to second terminal ends;
    (e) the first terminal ends disposed in juxtaposed columns and juxtaposed rows of separate aperture areas in an apertured plate and spaced from the source of light;
    (f) the second terminal ends being arranged in the several parts bins;
    (g) the space between the source of light and the apertured plate having a peripheral opening being adapted for manual insertion and removal of replaceable punch cards having columns and rows of apertures alignable with the separate aperture areas with selectively determined punched out apertured areas for enabling the transmission of light through a punch card to illuminate corresponding first terminal ends of the fiber-optic cables; and
    (h) the second terminal ends of the fiber-optic cables being visible at the several parts bins so as to indicate to an assembly operator which parts to select for assembly of a particular workpiece.

2. The system of claim 1 in which the work station comprises an assembly fixture and at least one of said second terminal ends being disposed on the fixture to indicate the location of a specific part of the workpiece.

3. The system of claim 1 in which the punched out apertures are prepunched with required information.

* * * * *